US012676178B2

(12) United States Patent
Subramanian et al.

(10) Patent No.: US 12,676,178 B2
(45) Date of Patent: Jul. 7, 2026

(54) MEMORY PHYSICAL LAYER INTERFACE, MEMORY APPARATUS AND METHOD THEREOF

(71) Applicant: Faraday Technology Corp., Hsinchu (TW)

(72) Inventors: Sivaramakrishnan Subramanian, Bengaluru (IN); Hussainvali Shaik, Bangalore (IN); Sandeep Kumar Mohanta, Odisha (IN); Pydi Siva Sekhar, Andhra Pradesh (IN); Eswar Reddi, Andhrapradesh (IN); Basimsetti Subrahmanyam Suresh, Andhra Pradesh (IN)

(73) Assignee: Faraday Technology Corp., Hsinchu (TW)

( * ) Notice: Subject to any disclaimer, the term of this patent is extended or adjusted under 35 U.S.C. 154(b) by 127 days.

(21) Appl. No.: 18/929,638

(22) Filed: Oct. 29, 2024

(65) Prior Publication Data

US 2026/0120748 A1 Apr. 30, 2026

(51) Int. Cl.
*G11C 11/4076* (2006.01)
*G11C 11/4072* (2006.01)
*G11C 11/4093* (2006.01)

(52) U.S. Cl.
CPC ...... *G11C 11/4076* (2013.01); *G11C 11/4072* (2013.01); *G11C 11/4093* (2013.01)

(58) Field of Classification Search
CPC ............ G11C 11/4076; G11C 11/4072; G11C 11/4093
See application file for complete search history.

(56) References Cited

U.S. PATENT DOCUMENTS

| | | | |
|---|---|---|---|
| 11,417,374 B1 * | 8/2022 | Waldrop | G11C 11/4076 |
| 11,962,440 B2 | 4/2024 | Valaee et al. | |
| 12,444,452 B2 * | 10/2025 | Subramanian | G11C 7/222 |
| 2018/0294999 A1 * | 10/2018 | Giovannini | G06F 3/0673 |
| 2022/0262413 A1 | 8/2022 | Waldrop et al. | |
| 2023/0395105 A1 | 12/2023 | Waldrop et al. | |
| 2024/0347085 A1 | 10/2024 | Seo et al. | |
| 2024/0347102 A1 | 10/2024 | Waldrop et al. | |

OTHER PUBLICATIONS

"Notice of allowance of Taiwan Counterpart Application", issued on Nov. 18, 2025, p. 1-p. 4.

* cited by examiner

*Primary Examiner* — Min Huang
(74) *Attorney, Agent, or Firm* — JCIPRNET

(57) ABSTRACT

A memory apparatus includes a memory device, a memory controller and a memory physical layer interface. The memory physical layer interface comprises a multi-tap decision feedback equalization (DFE) receiver and a tap reset circuit. The tap reset circuit generates a pulse signal and a reset signal in accordance with a gap interval between read bursts to reset a DFE taps of the multi-tap DFE receiver during the gap interval between the read bursts. The tap reset circuit resets the plurality of DFE taps using the pulse signal in response to determining that the gap interval between read bursts is a first predetermined interval. The tap reset circuit resets the plurality of DFE taps of the multi-tap DFE receiver using the reset signal in response to determining that the gap interval between read bursts is a second predetermined interval. The second predetermined interval is greater than the first predetermined interval.

20 Claims, 6 Drawing Sheets

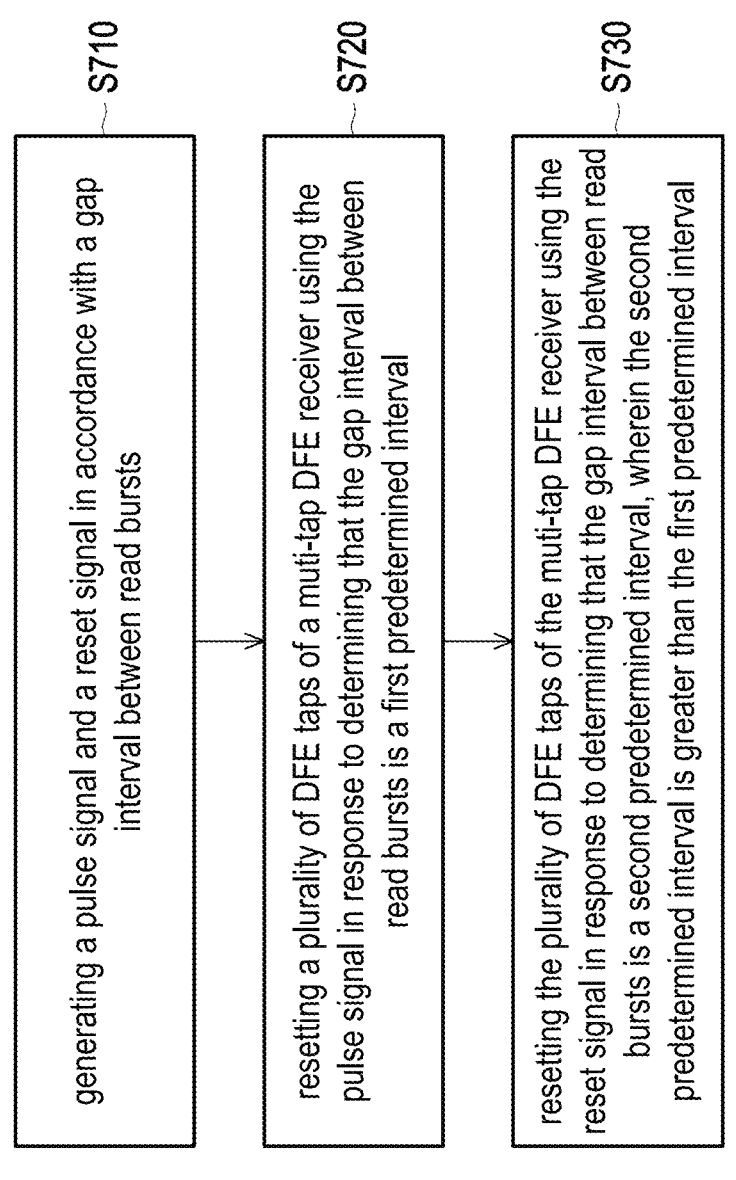

generating a pulse signal and a reset signal in accordance with a gap interval between read bursts — S710 resetting a plurality of DFE taps of a muti-tap DFE receiver using the pulse signal in response to determining that the gap interval between read bursts is a first predetermined interval — S720 resetting the plurality of DFE taps of the muti-tap DFE receiver using the reset signal in response to determining that the gap interval between read bursts is a second predetermined interval, wherein the second predetermined interval is greater than the first predetermined interval — S730

FIG. 7

MEMORY PHYSICAL LAYER INTERFACE, MEMORY APPARATUS AND METHOD THEREOF

BACKGROUND

Technical Field

The disclosure generally relates to a memory apparatus, and more particularly related to resetting decision feedback equalization (DFE) taps of a multi-tap DFE receiver in the memory apparatus.

Description of Related Art

A memory apparatus, such as a double data rate dynamic random-access memory (DDR RAM) is used widely in many electronic devices. The memory apparatus may utilize a multi-tap DFE receiver to meet high-speed and low-power consumption requirements. The multi-tap DFE receiver may have one or more DFE taps, and the DFE taps of the multi-tap DFE receiver must be reset appropriately between read bursts. However, resetting the DFE taps between read bursts is challenging, as there is no data between the read bursts and gap intervals between read bursts vary between two adjacent reads. As such, it is challenging to meet timing requirements to reset the DFE taps across different frequencies.

It is desirable for a creative design of the memory apparatus that may reset robustly and effectively DFE taps of the multi-tap DFE receiver across different frequencies.

SUMMARY

The disclosure introduces a memory apparatus, a memory physical layer interface and a method that are capable of resetting DFE taps of a multi-tap DFE receiver effectively between read bursts across different frequencies.

In some embodiments, a memory apparatus includes a memory device, a memory controller, and a memory physical layer interface that is coupled between the memory device and the memory controller. The memory physical layer interface includes a tap reset circuit and a multi-tap decision feedback equalization (DFE) receiver, in which the multi-tap DFE receiver may have a plurality of DFE taps. The multi-tap DFE receiver generates a pulse signal and a reset signal in accordance with a gap interval between read bursts to reset the plurality of DFE taps of the multi-tap DFE receiver during the gap interval between the read bursts. The tap reset circuit is configured to reset the plurality of DFE taps of the multi-tap DFE receiver using the pulse signal in response to determining that the gap interval between read bursts is a first predetermined interval. The tap reset circuit is configured to reset the plurality of DFE taps of the multi-tap DFE receiver using the reset signal in response to determining that the gap interval between read bursts is a second predetermined interval. The second predetermined interval is greater than the first predetermined interval.

In some embodiments, a memory physical layer interface includes a tap reset circuit and a multi-tap decision feedback equalization (DFE) receiver, in which the multi-tap DFE receiver may have a plurality of DFE taps. The multi-tap DFE receiver generates a pulse signal and a reset signal in accordance with a gap interval between read bursts to reset the plurality of DFE taps of the multi-tap DFE receiver during the gap interval between the read bursts. The tap reset circuit is configured to reset the plurality of DFE taps of the multi-tap DFE receiver using the pulse signal in response to determining that the gap interval between read bursts is a first predetermined interval. The tap reset circuit is configured to reset the plurality of DFE taps of the multi-tap DFE receiver using the reset signal in response to determining that the gap interval between read bursts is a second predetermined interval. The second predetermined interval is greater than the first predetermined interval.

In some embodiments, a method of memory apparatus comprising a memory device, a memory controller and a memory physical layer interface. The memory physical layer interface comprising a multi-tap DFE receiver and a tap reset circuit. The method includes steps of generating a pulse signal and a reset signal in accordance with a gap interval between read bursts; resetting a plurality of DFE taps of the muti-tap DFE receiver using the pulse signal in response to determining that the gap interval between read bursts is a first predetermined interval; and resetting the plurality of DFE taps of the muti-tap DFE receiver using the reset signal in response to determining that the gap interval between read bursts is a second predetermined interval, wherein the second predetermined interval is greater than the first predetermined interval.

In the above embodiments, a tap reset circuit of the memory physical layer interface may generate a pulse signal and a reset signal according to a gap interval between read bursts for resetting DFE taps of a muti-tap DFE receiver. When the gap interval between the read bursts is a first predetermined interval, the DFE taps of the muti-tap DFE receiver is reset using the pulse signal generated by the tap reset circuit. When the gap interval between the read bursts is a second predetermined interval that is greater than the first predetermined interval, the DFE taps of the muti-tap DFE receiver is reset using the reset signal generated by the tap reset circuit. In this way, the DFE taps of the muti-tap DFE receiver may be reset effectively and robustly across different frequencies. The memory physical layer interface may further include a training logic that is configured to perform a training process to align the pulse signal and the reset signal with the gated clock signal. Accordingly, the pulse signal and the reset signal meet timing requirements at the muti-tap DFE receiver and the memory apparatus.

BRIEF DESCRIPTION OF THE DRAWINGS

FIG. 7 illustrates flowchart diagram of a method of a memory apparatus in accordance with some embodiments.

DESCRIPTION OF THE EMBODIMENTS

Figure 1:
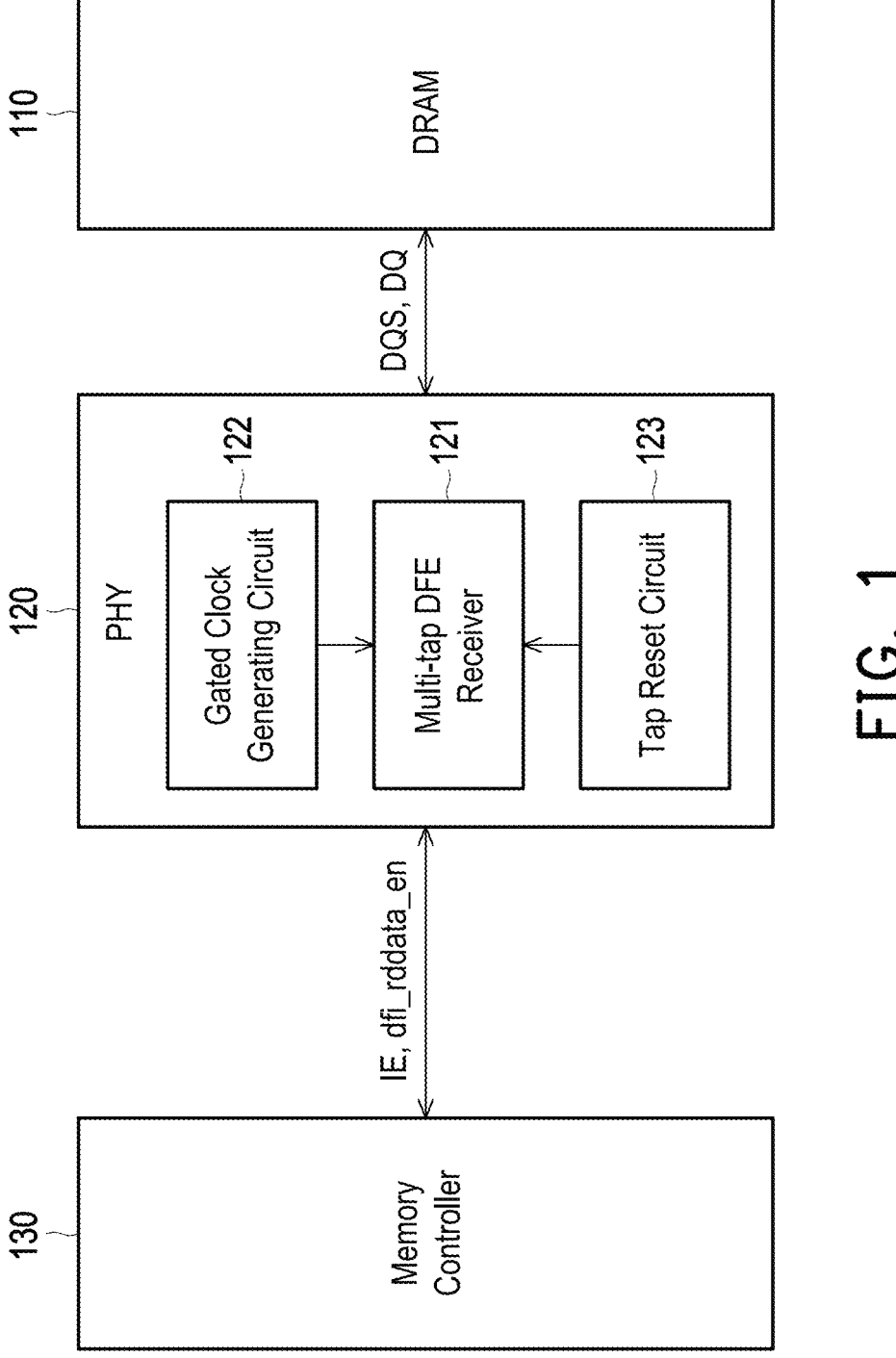
FIG. 1 illustrates a schematic diagram of a memory apparatus in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a memory apparatus 100 that includes a memory device 110, a memory physical layer interface (PHY) 120, and a memory controller 130. The memory device 110 may include a plurality of memory banks (not shown), and each memory bank may include a plurality of memory cells for storing data. The memory banks of the memory device 110 may be double data rate (DDR) memory banks. In an embodiment, the memory device 110 is a low-power double data rate (LPDDR) dynamic random-access memory (DRAM). An arrangement and a size of each memory bank of the memory device 110 may vary based on requirements of the memory apparatus 100.

The memory controller 130 may generate various control commands and/or data for controlling the memory apparatus 100. For example, the memory controller 130 may include logic circuits for controlling a read operation and a write operation on the memory device 110. The memory controller 130 may control operations of the memory device 110 using commands transmitted to the memory device 110 via the PHY 120. In some embodiments, the memory controller 130 provide at least an internal enable signal IE and a read enable signal dfi_rddata_en to the PHY 120 to read data in read bursts. The PHY 120 may generate signals based on the received internal enable signal IE and the received read enable signal dfi_rddata_en to reset DFE taps between read bursts. A circuit structure of the memory controller 130 are not limited in the disclosure and may vary according to requirements of the memory apparatus 100.

The PHY 120 is coupled between the memory device 110 and the memory controller 130. In some embodiments, the PHY 120 may communicate with the memory device 110 and the memory controller 130 via different interfaces. For example, the PHY 120 may communicate with the memory device 110 via a DRAM interface (not shown), and the PHY 120 may communicate with the memory controller 130 via a DFI (DDR PHY Interface) interface (not shown). The PHY 120 may include a multi-tap DFE receiver 121, a gated clock generating circuit 122 and a tap reset circuit 123. The multi-tap DFE receiver 121 may receive data and clock information from the memory device 110, and may sample received data to generate output data. The multi-tap DFE receiver 121 may include a plurality of DFE taps (not shown) which are also known as feedback taps of the multi-tap DFE receiver 121. Values of the DFE taps of the multi-tap DFE receiver 121 may be determined based on previously sampled data values. In an embodiment, the multi-tap DFE receiver 121 is four-tap DFE receiver that includes four DFE taps whose values depend on the previously four sampled data values. The multi-tap DFE receiver 121 may adjust the currently sample data value (i.e., data signal DQ) based on the values of the DFE taps. For example, when the value of a DFE tap (i.e., previously sample data value) is "1", the multi-tap DFE receiver 121 may subtract a specific signal (i.e., −ve signal) from the currently sampled data value; and when the value of the DFE tap (i.e., previously sampled data value) is "0", the multi-tap DFE receiver 121 may add the specific signal (i.e., +ve signal) to the currently sample data value. The DFE taps should be reset when a first read burst or multiple read bursts are performed on the memory apparatus 100.

When multiple read bursts are performed, the DFE taps of the multi-tap DFE receiver 121 should be reset during the gap interval between the read bursts. A length of the gap interval between the read bursts may vary depending on a frequency of the memory apparatus 100. Furthermore, the reset of the DFE taps should be performed differently depending on the length of the gap interval between the read bursts. For example, when the gap interval between a first read burst and a second read burst is a one-cycle interval, the first DFE tap (i.e., Tap 1) should be reset to "1", the second DFE tap (i.e., Tap 2) should be reset to "1", the third DFE tap (i.e., Tap 3) should be the last sampled data value during the first read burst, and the fourth DFE tap (i.e., Tap 4) should be the last but one sampled data value during the first read burst. When the gap interval between the first read burst and the second read burst is n-cycle interval in which n is an integer greater than or equal to 2, all the four DFE taps (i.e., Tap 1, Tap 2, Tap 3, Tap 4) in the second read burst should be reset to "1".

The gated clock generating circuit 122 is configured to generate a gated clock signal according to the read enable signal dfi_rddata_en provided by the memory controller 130. The gated clock generating circuit 122 may output the gated clock signal to the multi-tap DFE receiver 121 for generating the output data. The tap reset circuit 123 is electrically connected to the multi-tap DFE receiver 121 and is configured to generate a pulse signal and a reset signal for resetting DFE taps of the multi-tap DFE receiver 121. The DFE taps of the multi-tap DFE receiver 121 may be reset using the pulse signal when the gap interval between the read bursts is a first predetermined interval (i.e., one-cycle interval); and the DFE taps of the multi-tap DFE receiver 121 may be reset using the reset signal when the gap interval between the read bursts is a second predetermined interval (i.e., n-cycle interval in which n is an integer greater than or equal to 2).

Figure 2:
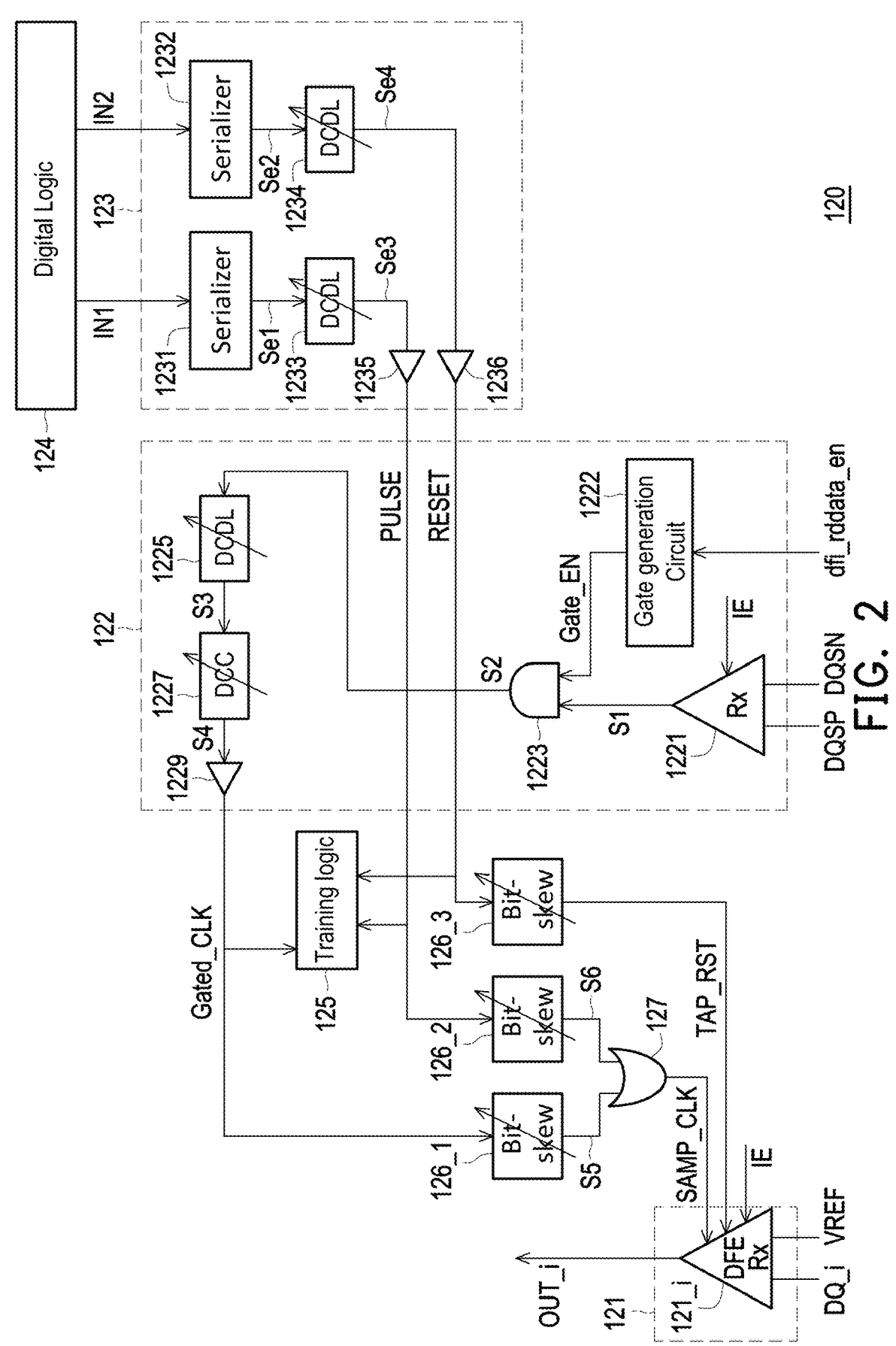
FIG. 2 illustrates a schematic diagram of memory physical layer interface of a memory apparatus in accordance with some embodiments.

FIG. 2 illustrates a schematic diagram of a memory physical layer interface (PHY) 120 of the memory apparatus 100 in accordance with some embodiments. The PHY 120 may include the multi-tap DFE receiver 121, the gated clock generating circuit 122, the tap reset circuit 123, a digital logic 124, a training logic 125, a plurality of delay elements 126_1, 126_2, 126_3 and a logic gate 127.

The digital logic 124 may supply input signals IN1 and IN2 to the tap reset circuit 123 for the tap reset circuit 123 to generate the pulse signal PULSE and/or the reset signal RESET. When the digital logic 124 asserts the input signal IN1 to the tap reset circuit 123, the tap reset circuit 123 generates and outputs the pulse signal PULSE. When the digital logic 124 asserts the input signal IN2 to the tap reset circuit 123, the tap reset circuit 123 generates and outputs the reset signal RESET. In some embodiments, the digital logic 124 asserts the input signal IN1 to the tap reset circuit 123 in response to determining that the gap interval between read bursts is the first predetermined interval (i.e., one-cycle interval). The digital logic 124 may assert the input signal IN2 to the tap reset circuit 123 in response to determining that the gap interval between the read bursts is the second predetermined interval (i.e., n-cycle interval). A length of the gap interval between the read bursts may be determined based on the read enable signal dfi_rddata_en. The input signals IN1 and IN2 output by the digital logic 124 may be parallel input signals, but the disclosure is not limited thereto.

The tap reset circuit 123 is configured to generate the pulse signal PULSE and the reset signal RESET according to input signals IN1 and IN2. The tap reset circuit 123 may include serializers 1231 and 1232, delay circuits 1233 and 1234, and buffers 1235 and 1236.

The serializer 1231, the delay circuit 1233 and the buffer 1235 of the tap reset circuit 123 are configured to generate the pulse signal PULSE based on the input signal IN1. More specifically, the serializer 1231 may receive the input signal IN1 from the digital logic 124, generate a serial signal Se1 based on the received input signal IN1, and output the serial signal Se1 to the delay circuit 1233. The delay circuit 1233 may delay the serial signal Se1 to generate a delayed serial signal Se3 and output the delayed serial signal Se3 to the buffer 1235. The buffer 1235 may output the pulse signal PULSE based on the delayed serial signal Se3.

Similarly, the serializer 1232, the delay circuit 1234 and the buffer 1236 of the tap reset circuit 123 may be configured to generate the reset signal RESET based on the input signal IN2. More specifically, the serializer 1232 may receive the input signal IN2 from the digital logic 124, generate a serial signal Se2 based on the received input signal IN2, and output the serial signal Se2 to the delay circuit 1234. The delay circuit 1234 may delay the serial signal Se2 to generate a delayed serial signal Se4 and output the delayed serial signal Se4 to the buffer 1236. The buffer 1236 may output the reset signal RESET based on the delayed serial signal Se4. In this way, the tap reset circuit 123 may generate and output the pulse signal PULSE and the reset signal RESET based on the input signals IN1 and IN2.

The gated clock generating circuit 122 may include a DQS receiver 1221, a gate generation circuit 1222, a logic gate 1223, a digitally controlled delay line (DCDL) 1225, a duty-cycle corrector (DCC) 1227, and a buffer 1229. The DQS receiver 1221 is configured to receive the internal enable signal IE and a DQS pair DQSP and DQSN. The DQS receiver 1221 is configured to generate a signal S1 based on the internal enable signal IE and the DQS pair DQSP and DQSN. The gate generation circuit 1222 is configured to receive the read enable signal dfi_rddata_en, and generate a gate enable signal Gate_EN base on the received read enable signal dfi_rddata_en. The gate generation circuit 1222 may receive the read enable signal dfi_rddata_en from the memory controller 130 in some embodiments. The disclosure does not intend to limit circuit structure of the DQS receiver 1221 and the gate generation circuit 1222 to any circuit structures.

The logic gate 1223 is coupled to the DQS receiver 1221 and the gate generation circuit 1222 to receive the signal S1 and the gate enable signal Gate_EN from the DQS receiver 1221 and the gate generation circuit 1222. The logic gate 1223 may perform a logic operation on the signal S1 and the gate enable signal Gate_EN to generate a signal S2. The logic gate 1223 may be an AND gate, and the logic operation performed by the logic gate 1223 may be the AND operation, but the disclosure is not limited thereto.

The DCDL 1225 is configured to delay the signal S2 by controllable delay amount to generate a signal S3; and the DCC 1227 is configured to delay the signal S3 to generate a signal S4. The buffer 128 may receive the signal S4 and output the gated clock signal Gated_CLK based on the received signal S4. The gated clock generating circuit 122 outputs the gated clock signal Gated_CLK to the training logic 125 and the delay element 126_1.

The training logic 125 of the PHY 120 is coupled to the gated clock generating circuit 122 and the tap reset circuit 123 to receive the gated clock signal Gated_CLK, the pulse signal PULSE and the reset signal RESET. The training logic 125 is configured to perform a training process to align the pulse signal PULSE and the reset signal RESET to the gated clock signal Gated_CLK. In some embodiments, the training logic 125 may repeatedly adjust delay amount of the pulse signal PULSE until the pulse signal PULSE aligns to the gated clock signal Gated_CLK. The training logic 125 may control to change a DCDL code and cycle delay in a path of the pulse signal till both the pulse signal PULSE and gated clock signal Gated_CLK are aligned. For example, the training logic 125 may control to change the DCDL code of the delay circuit 1233 till the pulse signal PULSE aligns to the Gated_CLK. Similarly, the training logic 125 may repeatedly adjust delay amount of the reset signal RESET until the reset signal RESET aligns to the gated clock signal Gated_CLK. The training logic 125 may control to change the DCDL code of the delay circuit 1234 till reset signal RESET aligns the Gated_CLK. The training logic 125 may end the training process after the pulse signal PULSE and the reset signal RESET align to the gated clock signal Gated_CLK. After the training process is completed, the DCDL codes of the delay circuits 1233 and 1234 may be recorded, and the tap reset circuit outputs the pulse signal PULSE and the reset signal RESET using the recorded DCDL codes of the delay circuits 1233 and 1234. In other words, after the training, the pulse signal PULSE and the reset signal RESET generated by the tap reset circuit and the gated clock signal Gated_CLK meet the timing requirements at the multi-tap DFE receiver 121. In some embodiments, the training logic 125 performs the training process after all relevant write and read interface DRAM trainings have been performed successfully. As such, the pulse signal PULSE and the reset signal RESET after being trained meet the timing requirements of the memory apparatus 100.

The delay element 126_1 is connected to the gated clock generating circuit 122 to receive the gated clock signal Gated_CLK; and the delay elements 126_2 and 126_3 are connected to the tap reset circuit 123 to receive the pulse signal PULSE and the reset signal RESET. The delay element 126_1 is configured to delay the gated clock signal Gated_CLK to generate a signal S5; the delay element 126_2 is configured to delay the pulse signal PULSE to generate a signal S6; and the delay element 126_3 is configured to delay the reset signal RESET to generate a tap reset signal TAP_RST. The logic gate 127 is connected to the delay elements 126_1 and 126_2 to receive the signals S5 and S6, respectively. The logic gate 127 may perform a logic operation on the received signals S5 and S6 to generate a sample clock signal SAMP_CLK. The logic gate 127 may be an OR gate that perform an OR logic operation on the signals S5 and S6 to generate the sample clock signal SAMP_CLK. The sample clock signal SAMP_CLK and the tap reset signal TAP_RST are provided to the multi-tap DFE receiver 121.

The multi-tap DFE receiver 121 may include a plurality of receiving circuits 121_i. For simplicity, FIG. 2 shows only one receiving circuit 121_i, but it is appreciated that the multi-tap DFE receiver 121 may include a plurality of receiving circuits 121_i. The receiving circuit 121_i may receive a data signal DQi and a reference voltage VREF, and the receiving circuit 121_i may compare the reference voltage VREF with the received data signal DQi to generate a digital output signal OUT_i. The multi-tap DFE receiver 121 may further receive the sample clock signal SAMP_CLK that may provide timing information for the receiving circuit 121_i to generate and output the digital output signal OUT_i.

The receiving circuits 121_i of the multi-tap DFE receiver 121 may further receive the tap reset signal TAP_RST and the internal enable signal IE. The multi-tap DFE receiver 121 may reset the DFE taps of the multi-tap DFE receiver 121 based on the internal enable signal IE, the sample clock signal SAMP_CLK and the tap reset signal TAP_RST. Since the sample clock signal SAMP_CLK is generated based on the pulse signal PULSE and the tap reset signal TAP_RST is generated based on the reset signal RESET, the multi-tap DFE receiver 121 may reset the DFE taps based on the pulse signal PULSE and the reset signal RESET. The DFE taps of the multi-tap DFE receiver 121 may be reset before the first read burst and during the gap interval between two read bursts. Upon the length of the gap interval between read bursts, the DFE taps of the multi-tap DFE receiver 121 may be reset using the pulse signal PULSE or the reset signal RESET. When the length of the gap interval between read bursts is one-cycle interval, the DFE taps are reset using the pulse signal PULSE; and when the length of the gap interval between read bursts is n-cycle interval, the DFE taps may be reset using the reset signal RESET.

Figures 3, 4:
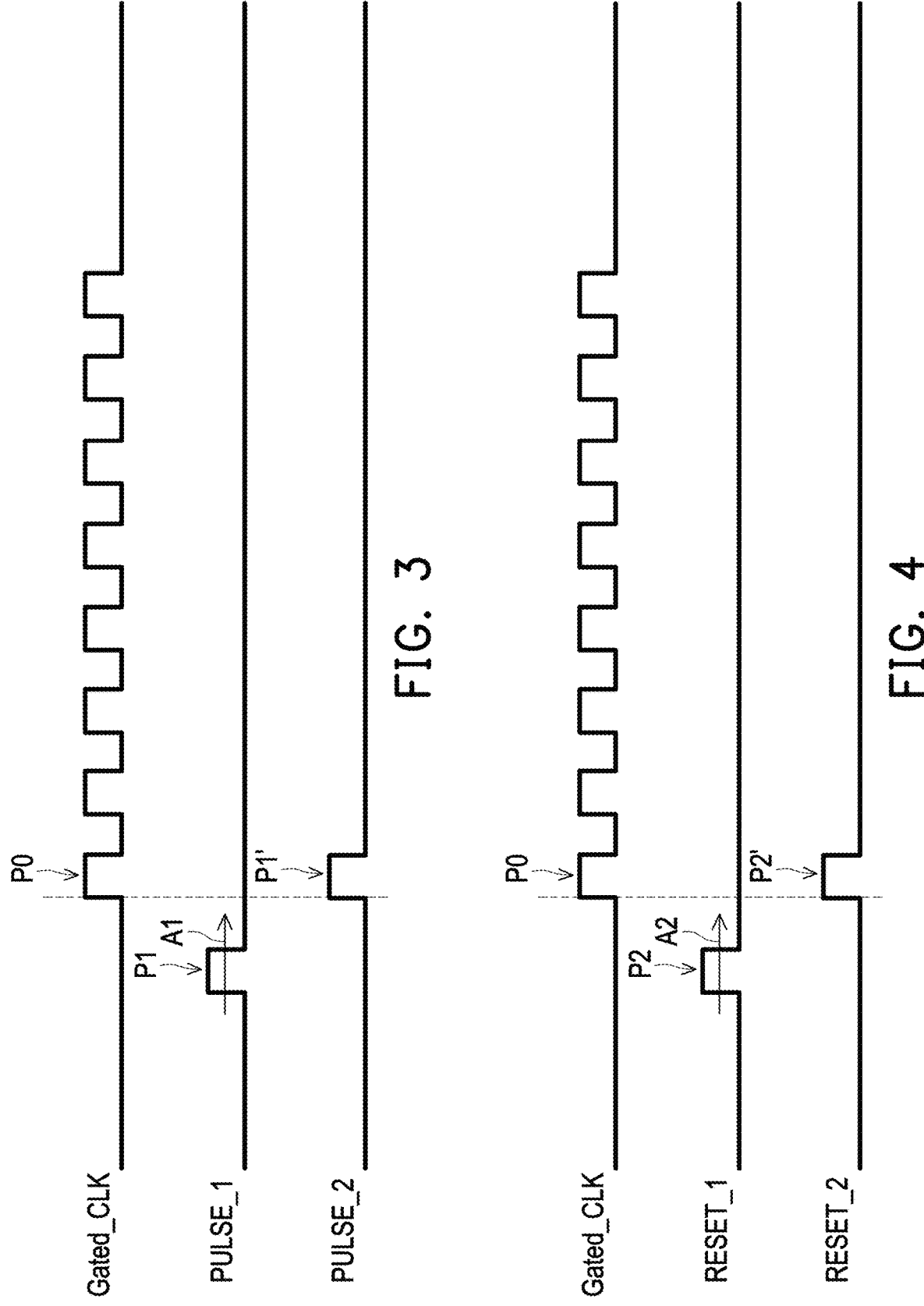
FIG. 3 illustrates a timing diagram of signals during training process for aligning a pulse signal with a gated clock signal in accordance with some embodiments.
FIG. 4 illustrates a timing diagram of signals during training for aligning a reset signal with a gated clock signal in accordance with some embodiments.

FIG. 3 illustrates a timing diagram of a gated clock signal Gated_CLK and pulse signals PULSE_1 and PULSE_2 during a training process in accordance with some embodiments. Referring to FIG. 2 and FIG. 3, the gated clock signal Gated_CLK is generated by the gated clock generating circuit 122, and the pulse signals PULSE_1 and PULSE_2 are generated by the tap reset circuit 123. The gated clock signal Gated_CLK is a clock signal having a plurality of pulses P0. The pulse signal PULSE_1 is a pulse signal generated by the tap reset circuit 123 before the training process is executed by the training logic 125. The pulse signal PULSE_2 is the pulse signal generated by the tap reset circuit 123 after the training process is executed by the training logic 125. The pulse signal PULSE_1 includes a pulse P1 that does not align to a pulse P0 of the gated clock signal Gated_CLK. During the training process, the delay of the pulse P1 of the pulse signal PULSE_1 is adjusted till the pulse P1 aligns to the gated clock signal Gated_CLK. In an example, the DCDL code and cycle delay in the path of the pulse signal PULSE are changed till both the pulse signal and GATED_CLK are aligned. The arrow A1 in FIG. 3 indicates an adjustment of the pulse signal PULSE_1 during the training process. After the training process is completed by the training logic 125, a pulse P1' of the pulse signal PULSE_2 aligns to the pulse P0 of the gated clock signal Gated_CLK. The training logic 125 may end the training process after the pulse signal generated by the tap reset circuit 123 aligns with the gated clock signal Gated_CLK generated by the gated clock generating circuit 122. As such, the training logic 125 may perform the training process to align the pulse signal PULSE with the gated clock signal Gated_CLK.

FIG. 4 illustrates a timing diagram of a gated clock signal Gated_CLK and reset signals RESET_1 and RESET_2 during a training process in accordance with some embodiments. Referring to FIG. 2 and FIG. 4, the pulse signals RESET_1 and RESET_2 are generated by the tap reset circuit 123. The reset signal RESET_1 is the reset signal generated by the tap reset circuit 123 before the training process is executed by the training logic 125, and the reset signal RESET_2 is the reset signal generated by the tap reset circuit 123 after the training process is executed by the training logic 125. The reset signal RESET_1 includes a pulse P2 that does not align to a pulse P0 of the gated clock signal Gated_CLK. During the training process, the delay of the pulse P2 of the reset signal RESET_1 is adjusted till the pulse P2 aligns to the pulse P0 of the gated clock signal Gated_CLK. In an example, the DCDL code and cycle delay in a path of the reset signal are changed till both the reset signal and GATED_CLK are aligned. The arrow A2 in FIG. 4 indicates an adjustment of the reset signal RESET_1 during the training process. After the training process is completed by the training logic 125, a pulse P2' of the reset signal RESET_2 generated by the tap reset circuit 123 aligns to the pulse P0 of the gated clock signal Gated_CLK. The training logic 125 may end the training process after the reset signal generated by the tap reset circuit 123 aligns with the gated clock signal Gated_CLK generated by the gated clock generating circuit 122. As such, the training logic 125 may perform the training process to align the reset signal RESET with the gated clock signal Gated_CLK.

Figure 5:
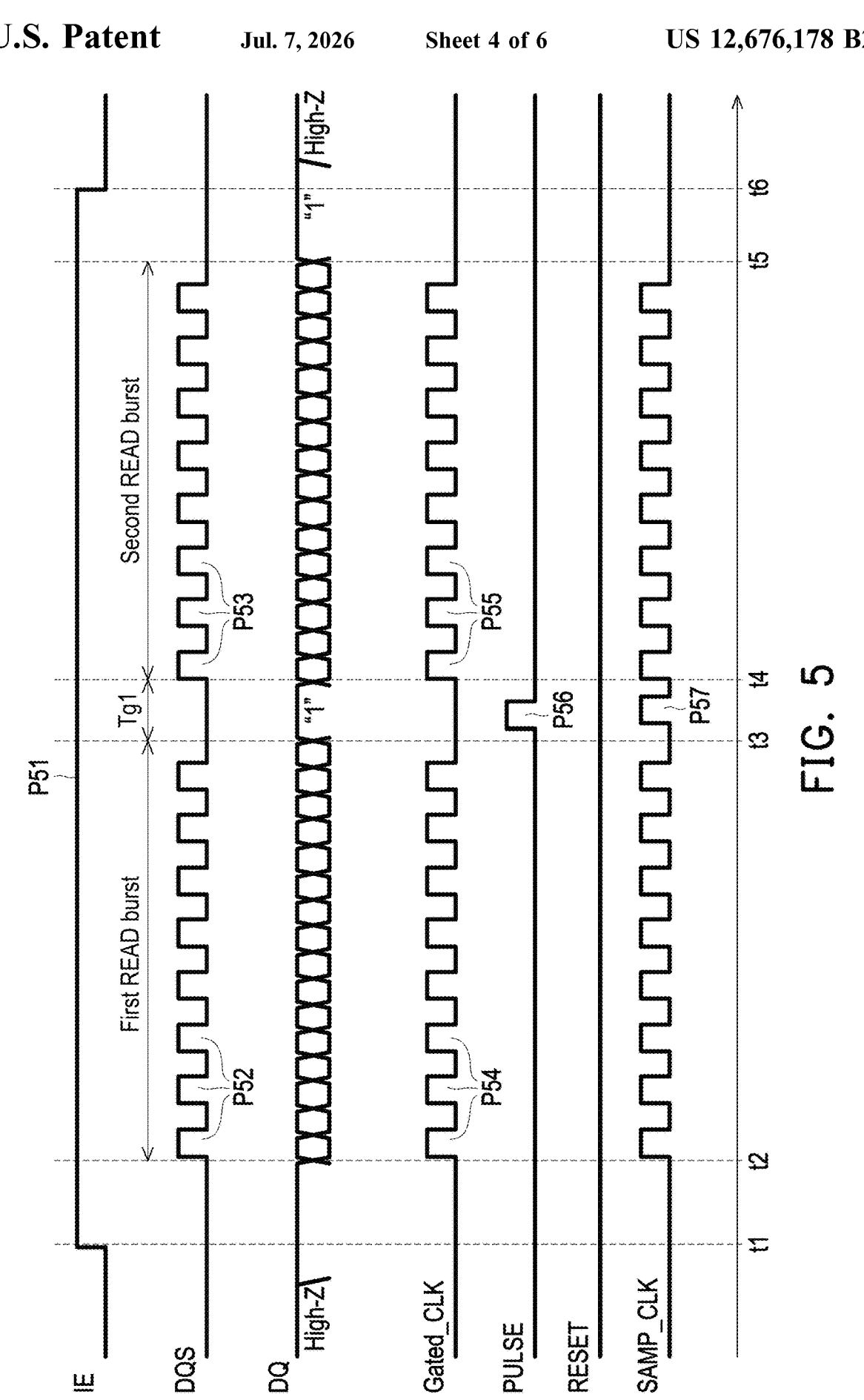
FIG. 5 illustrates a timing diagram of signals for resetting DFE taps using a pulse signal in accordance with some embodiments.

FIG. 5 illustrates a timing diagram of signals for resetting DFE taps of a multi-tap DFE receiver using a pulse signal PULSE in accordance with some embodiments. The signals shown in FIG. 5 includes the internal enable signal IE, the data strobe signal DQS, the data signal DQ, the gated clock signal Gate_CLK, the pulse signal PULSE, the reset signal RESET and the sample clock signal SAMP_CLK. Referring to FIG. 1, FIG. 2 and FIG. 5, the internal enable signal IE may be provided by the memory controller 130; the data strobe signal DQS and the data signal DQ may be provided by the memory device 110; the gated clock signal Gate_CLK is output by the gated clock generating circuit 122; the pulse signal PULSE and the reset signal RESET are output by tap reset circuit 123; and the sample clock signal SAMP_CLK are output by the logic gate 127.

The internal enable signal IE may include a pulse P11 which rises at t1 and falls at t6. In other words, the internal enable signal IE is at a high logic state during a time interval from t1 to t6. A pulse width of the pulse P11 may be determined by the memory controller.

The data strobe signal DQS may include a plurality of pulses P52 and a plurality of pulses P53, in which there is a gap between the pulses P52 and pulses P53. The pulses P52 are generated during a first read burst, and the pulses P53 are generated during a second read burst. The first read burst may be executed during an interval from t2 to t3, and the second read burst may be executed during an interval from t4 to t5. The gap between the pulses P52 and the pulses P53 may correspond to the gap interval Tg1 between the first read burst and the second read burst. In FIG. 5, the gap interval Tg1 between the first read burst and the second read burst is equivalent to one-cycle interval. The first read burst and the second read burst may be two consecutive read bursts, in which the second read burst is performed after the first read burst. In an embodiment, the data strobe signal DQS includes eight pulses P52 and eight pulses P53 corresponding to eight system clock cycles of the memory apparatus 100. It notes that the disclosure does not intend to limit the number of pulses P52 and P53 of the data strobe signal DQS.

The data signal DQ may carry output data that are transmitted in synchronization with the pulses of the data strobe signal DQS during the read bursts. The data signal DQ may be in a high logic state (logic state of "1") or unknown logic state high-Z outside the first read burst and the second read burst.

The gated clock signal Gated_CLK may include a plurality of pulses P54 and a plurality of pulses P55, in which there is a gap between the pulses P54 and pulses P55. The pulses P54 are generated during the first read burst, and the pulses P55 are generated during the second read burst. The gap between the pulses P54 and the pulses P55 may correspond to the gap interval Tg1 between the first read burst and the second read burst. The gated clock signal Gated_CLK shown in FIG. 5 includes eight pulses P54 and eight pulses P55, but the disclosure is not limited thereto.

In FIG. 5, it assumes that the gap interval Tg1 illustrated in FIG. 5 is one-cycle interval (i.e., first predetermined interval). Accordingly, the pulse signal PULSE is used to reset the DFE taps of the muti-tap DFE receiver 121, and the reset signal RESET is not used to reset the DFE taps of the muti-tap DFE receiver 121. As shown in FIG. 5, the reset signal RESET is set to the low logic state (i.e., "0"), and the pulse signal PULSE may include a pulse P56 located within an interval (i.e., interval between t3 and t4) corresponding to the gap interval Tg1. The pulse P56 of the pulse signal PULSE is configured to reset the DFE taps of the muti-tap DFE receiver 121. A location of the pulse P56 in the pulse signal PULSE may be determined according to the length of the gap interval Tg1 and may be controlled by the digital logic 124 of the PHY 120. For example, the digital logic may control to pull the pulse signal PULSE by one cycle from final trained value of the pulse signal PULSE. The pulse signal PULSE is set to the low logic state (i.e., "0") outside the interval corresponding to the gap interval Tg1.

The sample clock signal SAMP_CLK is obtained by performing a logic operation (i.e., OR logic operation) on the gated clock signal Gated_CLK and the pulse signal PULSE. As shown in FIG. 5, the sample clock signal SAMP_CLK includes the pulses of the gated clock signal Gated_CLK and a pulse P57 which corresponds to the pulse P56 of the pulse signal PULSE. For a first data sampling of second read burst, the waveform of the gated clock signal Gated_CLK assures that the first tap (i.e., Tap 1) and the second tap (i.e., Tap 2) will be "1", and the third tap (i.e., Tap 3) and the fourth tap (i.e., Tap 4) will have last two sampled data value of first read burst.

Figure 6:
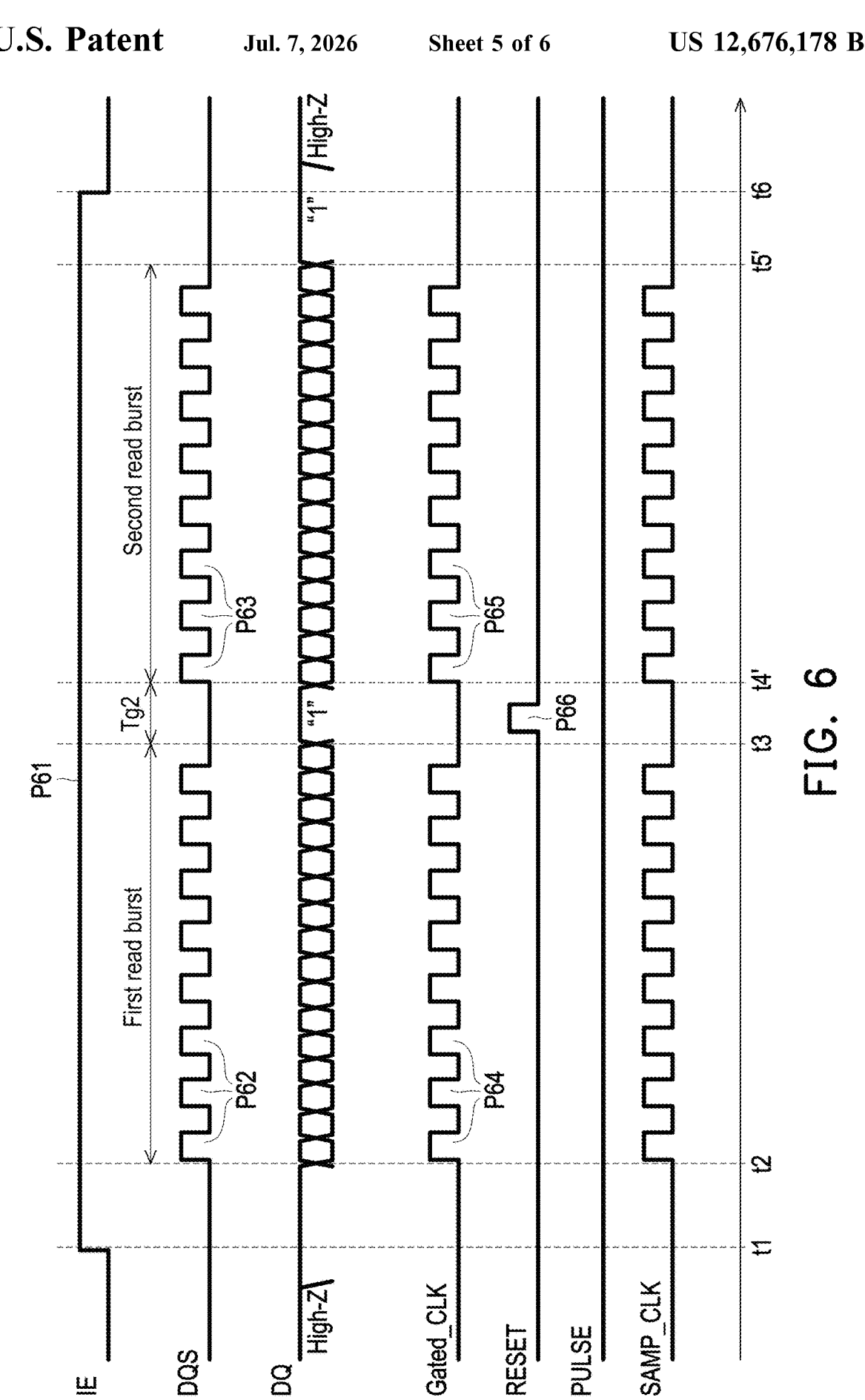
FIG. 6 illustrates a timing diagram of signals for resetting DFE taps using a reset signal in accordance with some embodiments.

FIG. 6 illustrates a timing diagram of signals for resetting DFE taps of a multi-tap DFE receiver using a reset signal RESET in accordance with some embodiments. The signals shown in FIG. 6 includes the internal enable signal IE, the data strobe signal DQS, the data signal DQ, the gated clock signal Gate_CLK, the pulse signal PULSE, the reset signal RESET and the sample clock signal SAMP_CLK. The waveform of the internal enable signal IE in FIG. 6 is same as that in FIG. 5, thus the detailed description is omitted hereafter.

A difference between the signals in FIG. 5 and FIG. 6 is that a gap interval Tg2 between the read bursts in FIG. 6 is greater than the gap interval Tg1 between the read bursts in FIG. 5. The first read burst is performed during an interval from t2 to t3, and the second read burst is performed during an interval from t4' and t5'. The gap interval Tg2 may be n-cycle interval, wherein n is an integer greater than or equal to 2. Accordingly, a gap (i.e., from t3 to t4') between pulses P62 and pulses P63 of the data strobe signal DQS and a gap (i.e., from t3 to t4') between pulses P64 and pulses P65 of the gated clock signal Gated_CLK in FIG. 6 are greater than those in FIG. 5.

Another difference between the signals in FIG. 5 and FIG. 6 is that the pulse signal PULSE in FIG. 6 is set to the low logic state (i.e., "0) and the reset signal RESET in FIG. 6 includes a pulse P66 within an interval (i.e., from t3 to t4') corresponding to the gap interval Tg2 between the read bursts. In other words, since the gap interval Tg2 is a second predetermined interval (i.e., n-cycle interval), the pulse signal PULSE is not used to reset the DFE taps, and the reset signal RESET is used to reset the DFE taps of the multi-tap DFE receiver. In some embodiments, the position of the pulse P66 in the reset signal RESET may be determined according to a length of the gap interval Tg2. For examples, the digital logic 125 may control to pull the reset signal RESET by one-and-a-half-cycle interval from the final trained value of the reset signal RESET when the gap interval Tg2 between the read bursts is two-cycle interval. In another example, the digital logic 125 may control to pull the reset signal RESET by two-cycle interval from the final trained value of the reset signal RESET when the gap interval Tg2 between the read bursts is three-cycle interval. It is appreciated that the disclosure does not intend to limit the gap interval Tg2 and the position of the pulse P66 in the reset signal RESET to any values. For a first data sampling of second read burst, the waveforms of the reset signal RESET and the gated clock signal Gated_CLK in FIG. 6 assure that the all the four DFE taps (i.e., Tap 1, Tap 2, Tap 3, and Tap 4) of the multi-tap DFE receiver are reset to "1" during the gap interval between read bursts.

FIG. 7 illustrates a flowchart diagram of a method of a memory apparatus in accordance with some embodiments. The memory apparatus may include a memory device, a memory controller and a memory physical layer interface, and the memory physical layer interface includes a multi-tap decision feedback equalization (DFE) receiver and a tap reset circuit.

In step S710, the method generates a pulse signal and a reset signal in accordance with a gap interval between read bursts. In step S720, the method resets a plurality of DFE taps of the muti-tap DFE receiver using the pulse signal in response to determining that the gap interval between read bursts is a first predetermined interval. In step S730, the method resets the plurality of DFE taps of the muti-tap DFE receiver using the reset signal in response to determining that the gap interval between read bursts is a second predetermined interval, wherein the second predetermined interval is greater than the first predetermined interval. In this way, the DFE taps of the multi-tap DFE receiver may be reset effectively and robustly between read bursts across different frequencies.

In summary, a memory physical layer interface of a memory apparatus includes a multi-tap DFE receiver and a tap reset circuit. The tap reset circuit is configured to generate a pulse signal and a reset signal for resetting DFE taps of the multi-tap DFE receiver. The DFE taps are reset for the first read burst or during a gap interval between read bursts. The DFE taps are reset using the pulse signal or the reset signal depending on a length of the gap interval between the read bursts. For example, when the gap interval between the read bursts is one-cycle interval (i.e., first predetermined interval), the DFE taps are reset using the pulse signal. When the gap interval between the read bursts is n-cycle interval (i.e., second predetermined interval) in which n is an integer greater than or equal to 2, the DFE taps are reset using the reset signal. The length of the gap interval between the read bursts may be determined according to a read enable signal that is supplied from a memory controller. In this way, the DFE taps of the multi-tap DFE receiver may be reset effectively and robustly across different frequencies. In addition, the memory physical layer interface further includes a training logic that is designed to align the pulse signal and the reset signal generated by the tap reset circuit with a gated clock signal. Accordingly, the trained reset signal and tap reset circuit meet the timing requirements of the multi-tap DFE receiver and the memory apparatus.

Although the embodiment of the disclosure has been described in detail, the disclosure is not limited to a specific embodiment and various modifications and changes are possible within the scope of the disclosure disclosed in the claims.

What is claimed is:

1. A memory apparatus, comprising:

a memory device;

a memory controller; and a memory physical layer interface, coupled between the memory device and the memory controller, the memory physical layer interface comprises:

a multi-tap decision feedback equalization (DFE) receiver, comprising a plurality of DFE taps; and a tap reset circuit, generating a pulse signal and a reset signal in accordance with a gap interval between read bursts to reset the plurality of DFE taps during the gap interval between the read bursts, wherein the tap reset circuit is configured to reset the plurality of DFE taps of the multi-tap DFE receiver using the pulse signal in response to determining that the gap interval between read bursts is a first predetermined interval, the tap reset circuit is configured to reset the plurality of DFE taps of the multi-tap DFE receiver using the reset signal in response to determining that the gap interval between read bursts is a second predetermined interval, and the second predetermined interval is greater than the first predetermined interval.

2. The memory apparatus of claim 1, wherein the memory physical layer interface further comprises a digital logic connected to the tap reset circuit, and the tap reset circuit comprises:

a first serializer, receiving a first input signal from the digital logic, generating a first serial signal in accordance with the first input signal;

a first delay circuit, connected to the first serializer, delaying the first serial signal to generate a first delayed serial signal, and a first buffer, connected to the first delay circuit, generating the pulse signal in accordance with the first delayed serial signal.

3. The memory apparatus of claim 2, wherein the tap reset circuit further comprises:

a second serializer, receiving a second input signal from the digital logic, generating a second serial signal in accordance with the second input signal;

a second delay circuit, connected to the second serializer, delaying the second serial signal to generate a second delayed serial signal; and a second buffer, connected to the second delay circuit, generating the reset signal in accordance with the second delayed serial signal.

4. The memory apparatus of claim 1, wherein the first predetermined interval is one-cycle interval, and the second predetermined interval is n-cycle interval, wherein n is an integer greater than or equal to 2.

5. The memory apparatus of claim 1, wherein the memory physical layer interface further comprises:

a gated clock generating circuit, receiving an internal enable signal and a read enable signal from the memory controller, and generating a gated clock signal in accordance with the internal enable signal and the read enable signal.

6. The memory apparatus of claim 5, wherein the gated clock generating circuit comprises:

a receiver, receiving the internal enable signal and data strobe signals, generating a first signal in accordance with the internal enable signal and the data strobe signals;

a gate generation circuit, receiving the read enable signal and generating a gate enable signal in accordance with the read enable signal;

a logic gate, coupled to the receiver and the gate generation circuit, receiving the first signal and the gate enable signal, generating a second signal in accordance with the first signal and the gate enable signal;

a digitally controlled delay line, coupled to the first logic gate, delaying the second signal to generate a third signal;

a duty-cycle corrector, delaying the third signal to generate a fourth signal; and a buffer, outputting the gated clock signal in accordance with the fourth signal.

7. The memory apparatus of claim 5, wherein the memory physical layer interface further comprises:

a training logic, coupled to the gated clock generating circuit and the tap reset circuit, receiving the gated clock signal, the pulse signal, and the reset signal, performing a training process to align the pulse signal and the pulse signal with the gated clock signal.

8. The memory apparatus of claim 7, wherein the training logic is configured to adjust delay amount of the pulse signal until the pulse signal aligns to the gated clock signal, and the training logic is configured to adjust delay amount of the reset signal until the pulse signal aligns to the gated clock signal.

9. The memory apparatus of claim 8, wherein the memory physical layer interface further comprises:

a first delay element, delaying the gated clock signal to generate a delayed clock signal;

a second delay element, delaying the pulse signal to generate a delayed pulse signal;

a third second delay element, delaying the reset signal to generate a tap reset signal;

a logic gate, coupled to the first delay element and the second delay element, performing a logic operation on the delayed clock signal and the delayed pulse signal to generate a sample clock signal.

10. The memory apparatus of claim 9, wherein the multi-tap DFE receiver is configured to receive a data signal, a reference voltage, the tap reset signal, the sample clock signal and the internal enable signal, the multi-tap DFE receiver is configured to generate an output data in accordance with the data signal, the reference voltage, the tap reset signal, the sample clock signal and the internal enable signal.

11. A memory physical layer interface, comprising:

a multi-tap decision feedback equalization (DFE) receiver, comprising a plurality of DFE taps; and a tap reset circuit, generating a pulse signal and a reset signal in accordance with a gap interval between read bursts to reset the plurality of DFE taps during the gap interval between the read bursts, wherein the tap reset circuit is configured to reset the plurality of DFE taps of the multi-tap DFE receiver using the pulse signal in response to determining that the gap interval between read bursts is a first predetermined interval, the tap reset circuit is configured to reset the plurality of DFE taps of the multi-tap DFE receiver using the reset signal in response to determining that the gap interval between read bursts is a second predetermined interval, and the second predetermined interval is greater than the first predetermined interval.

12. The memory physical layer interface of claim 11, wherein the memory physical layer interface further comprises a digital logic connected to the tap reset circuit, and the tap reset circuit comprises:

a first serializer, receiving a first input signal from the digital logic, generating a first serial signal in accordance with the first input signal;

a second serializer, receiving a second input signal from the digital logic, generating a second serial signal in accordance with the second input signal;

a first delay circuit, connected to the first serializer, delaying the first serial signal to generate a first delayed serial signal;

a second delay circuit, connected to the second serializer, delaying the second serial signal to generate a second delayed serial signal;

a first buffer, connected to the first delay circuit, generating the pulse signal in accordance with the first delayed serial signal; and a second buffer, connected to the second delay circuit, generating the reset signal in accordance with the second delayed serial signal.

13. The memory physical layer interface of claim 11, wherein the first predetermined interval is one-cycle interval, and the second predetermined interval is n-cycle interval, wherein n is an integer greater than or equal to 2.

14. The memory physical layer interface of claim 11, further comprising:

a training logic, receiving a gated clock signal, the pulse signal and the reset signal, performing a training process to align the pulse signal and the pulse signal with the gated clock signal, wherein the training logic is configured to adjust delay amount of the pulse signal until the pulse signal aligns to the gated clock signal, and the training logic is configured to adjust delay amount of the reset signal until the pulse signal aligns to the gated clock signal.

15. The memory physical layer interface of claim 14, further comprising:

a first delay element, delaying the gated clock signal to generate a delayed clock signal;

a second delay element, delaying the pulse signal to generate a delayed pulse signal;

a third second delay element, delaying the reset signal to generate a tap reset signal;

a logic gate, coupled to the first delay element and the second delay element, performing a logic operation on the delayed clock signal and the delayed pulse signal to generate a sample clock signal.

16. A method of a memory apparatus comprising a memory device, a memory controller and a memory physical layer interface, the memory physical layer interface comprising a multi-tap decision feedback equalization (DFE) receiver and a tap reset circuit, the method comprising:

generating a pulse signal and a reset signal in accordance with a gap interval between read bursts;

resetting a plurality of DFE taps of the muti-tap DFE receiver using the pulse signal in response to determining that the gap interval between read bursts is a first predetermined interval; and resetting the plurality of DFE taps of the muti-tap DFE receiver using the reset signal in response to determining that the gap interval between read bursts is a second predetermined interval, wherein the second predetermined interval is greater than the first predetermined interval.

17. The method of claim 16, wherein generating the pulse signal in accordance with the gap interval between read bursts comprises:

generating, by a first serializer of the tap reset circuit, a first serial signal in accordance with a first input signal received from a digital logic of the memory physical layer interface;

generating, by a second serializer of the tap reset circuit, a second serial signal in accordance with the second input signal received from the digital logic of the memory physical layer interface;

delaying, by a first delay circuit of the tap reset circuit, the first serial signal to generate a first delayed serial signal;

delaying, by a second delay circuit of the tap reset circuit, the second serial signal to generate a second delayed serial signal; and generating, by a first buffer of the tap reset circuit, the pulse signal in accordance with the first delayed serial signal; and generating, by a second buffer of the tap reset circuit, the reset signal in accordance with the second delayed serial signal.

18. The method of claim 16, wherein the first predetermined interval is one-cycle interval, and the second predetermined interval is n-cycle interval, wherein n is an integer greater than or equal to 2.

19. The method of claim 18, further comprising:

receiving, by a training logic of the memory physical layer interface, the gated clock signal, the pulse signal and the reset signal; and performing, by the training logic of the memory physical layer interface, a training process to align the pulse signal and the pulse signal with the gated clock signal, wherein the training logic is configured to adjust delay amount of the pulse signal until the pulse signal aligns to the gated clock signal, and the training logic is configured to adjust delay amount of the reset signal until the pulse signal aligns to the gated clock signal.

20. The method of claim 19, further comprising:

delaying, by a first delay element of the memory physical layer interface, the gated clock signal to generate a delayed clock signal;

delaying, by a second delay element of the memory physical layer interface, the pulse signal to generate a delayed pulse signal;

delaying, by a third second delay element of the memory physical layer interface, the reset signal to generate a tap reset signal; and performing, by a logic gate of the memory physical layer interface, a logic operation on the delayed clock signal and the delayed pulse signal to generate a sample clock signal.

* * * * *